(12) United States Patent
Ishimaru et al.

(10) Patent No.: US 11,749,684 B2
(45) Date of Patent: Sep. 5, 2023

(54) CIRCUIT DEVICE, LIGHT SOURCE DEVICE, AND ELECTRONIC APPARATUS

(71) Applicant: Seiko Epson Corporation, Tokyo (JP)

(72) Inventors: Kei Ishimaru, Chino (JP); Atsushi Yamada, Nagoya (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 16/943,173

(22) Filed: Jul. 30, 2020

(65) Prior Publication Data

US 2021/0035491 A1 Feb. 4, 2021

(30) Foreign Application Priority Data

Jul. 31, 2019 (JP) ................................ 2019-140789

(51) Int. Cl.
*H01L 27/092* (2006.01)
*H04N 9/31* (2006.01)
*G09G 3/32* (2016.01)
*H01L 27/06* (2006.01)
*H05B 45/30* (2020.01)
(Continued)

(52) U.S. Cl.
CPC .......... *H01L 27/0928* (2013.01); *G09G 3/32* (2013.01); *H01L 27/06* (2013.01); *H01L 29/0611* (2013.01); *H04N 9/3123* (2013.01); *H04N 9/3155* (2013.01); *H05B 45/30* (2020.01); *H10B 10/18* (2023.02); *G09G 3/001* (2013.01); *G09G 2330/12* (2013.01); *H01L 29/78* (2013.01); *H01L 29/8611* (2013.01)

(58) Field of Classification Search
CPC ............ H01L 27/0928; H01L 29/0611; H01L 27/1116; H01L 21/823878; H01L 21/761; H01L 21/823481; H01L 27/06; H01L 29/78; H01L 29/8611; H01L 27/0255; H01L 27/0629; G09G 3/32; G09G 3/001; G09G 2330/12; G09G 2300/0426; H04N 9/3123; H04N 9/3155; H05B 45/30
See application file for complete search history.

(56) References Cited

U.S. PATENT DOCUMENTS

| 5,905,679 | A | * | 5/1999 | Tsukikawa | .......... H01L 27/0928 257/355 |
| 6,924,535 | B2 | * | 8/2005 | Hayashi | ............... H01L 27/0928 257/500 |

(Continued)

FOREIGN PATENT DOCUMENTS

| JP | 2010-080472 A | 4/2010 |
| JP | 2014-027111 A | 2/2014 |
| JP | 2019-071269 A | 5/2019 |

*Primary Examiner* — Shouxiang Hu
(74) *Attorney, Agent, or Firm* — Harness, Dickey & Pierce, P.L.C.

(57) ABSTRACT

A circuit device includes an N-type well on a P-type substrate, a P-type well provided in the N-type well, a circuit element provided in the P-type well, a P-type well provided in an N-type well, and a circuit element provided in the P-type well. A ground power supply voltage is supplied to a P-type well. A power supply voltage different from the ground power supply voltage is supplied to a P-type well. The ground power supply voltage or a first potential that is greater than or equal to the potential of the ground power supply voltage and less than the potential of a high potential-side power supply voltage is supplied to an N-type well.

13 Claims, 13 Drawing Sheets

(51) Int. Cl.
*H01L 29/06* (2006.01)
*H10B 10/00* (2023.01)
*H01L 29/861* (2006.01)
*G09G 3/00* (2006.01)
*H01L 29/78* (2006.01)

(56) References Cited

U.S. PATENT DOCUMENTS

| | | | |
|---|---|---|---|
| 8,039,925 B2 * | 10/2011 | Wong | H01L 28/10 |
| | | | 257/536 |
| 2002/0015347 A1 * | 2/2002 | Kitamoto | H03K 19/0016 |
| | | | 257/E21.544 |
| 2003/0178683 A1 * | 9/2003 | Hayashi | H01L 27/0928 |
| | | | 257/368 |
| 2018/0180978 A1 | 6/2018 | Yamada et al. | |

* cited by examiner

CIRCUIT DEVICE, LIGHT SOURCE DEVICE, AND ELECTRONIC APPARATUS

The present application is based on, and claims priority from JP Application Serial Number 2019-140789, filed Jul. 31, 2019, the disclosure of which is hereby incorporated by reference herein in its entirety.

BACKGROUND

1. Technical Field

The present disclosure relates to a circuit device, a light source device, an electronic apparatus, and the like.

2. Related Art

In an integrated circuit device, a triple well structure is known in which an N-type well is provided in a P-type substrate, and a P-type well is provided in the N-type well. In JP-A-2014-027111, a known technique of the triple well structure is disclosed. In JP-A-2014-027111, the impurity concentrations of an N-type well contact that is in contact with an N-type well and a P-type well contact that is in contact with a P-type substrate are increased. With this, the resistance values of the N-type well and the P-type substrate are reduced, and as a result, occurrence of latch-up can be suppressed. In JP-A-2014-027111, the potential of the N-type well is set to a power supply voltage by setting the potential of the N-type well contact to the power supply voltage.

When a plurality of P-type wells whose potentials are different to each other are desired to be used, a method is conceivable in which each P-type well is isolated from a P-type substrate by an N-type well. Here, there is a problem that, unless the potentials of the N-type wells are appropriately set, element breakdown or an unexpected leak current may occur.

SUMMARY

One aspect of the present disclosure relates to a circuit device comprising: a first N-type well on a P-type substrate; a first P-type well that is provided in the first N-type well and to which a first ground power supply voltage is supplied; a first circuit element provided in the first P-type well; a second N-type well on the P-type substrate; a second P-type well that is provided in the second N-type well and to which a power supply voltage different from the first ground power supply voltage is supplied; and a second circuit element provided in the second P-type well, wherein the first ground power supply voltage or a first potential that is greater than or equal to the potential of the first ground power supply voltage and less than the potential of a high potential-side power supply voltage is supplied to the first N-type well.

BRIEF DESCRIPTION OF THE DRAWINGS

The disclosure will be described with reference to the accompanying drawings, wherein like numbers reference like elements.

DESCRIPTION OF EXEMPLARY EMBODIMENTS

Hereinafter, a preferable embodiment of the disclosure will be described in detail. Note that the embodiment given below is not intended to unduly limit the scope of the disclosure recited in the appended claims, and not all of the constituent elements described in the embodiment are essential to the disclosure.

1. Exemplary Circuit Configuration

Figure 1:
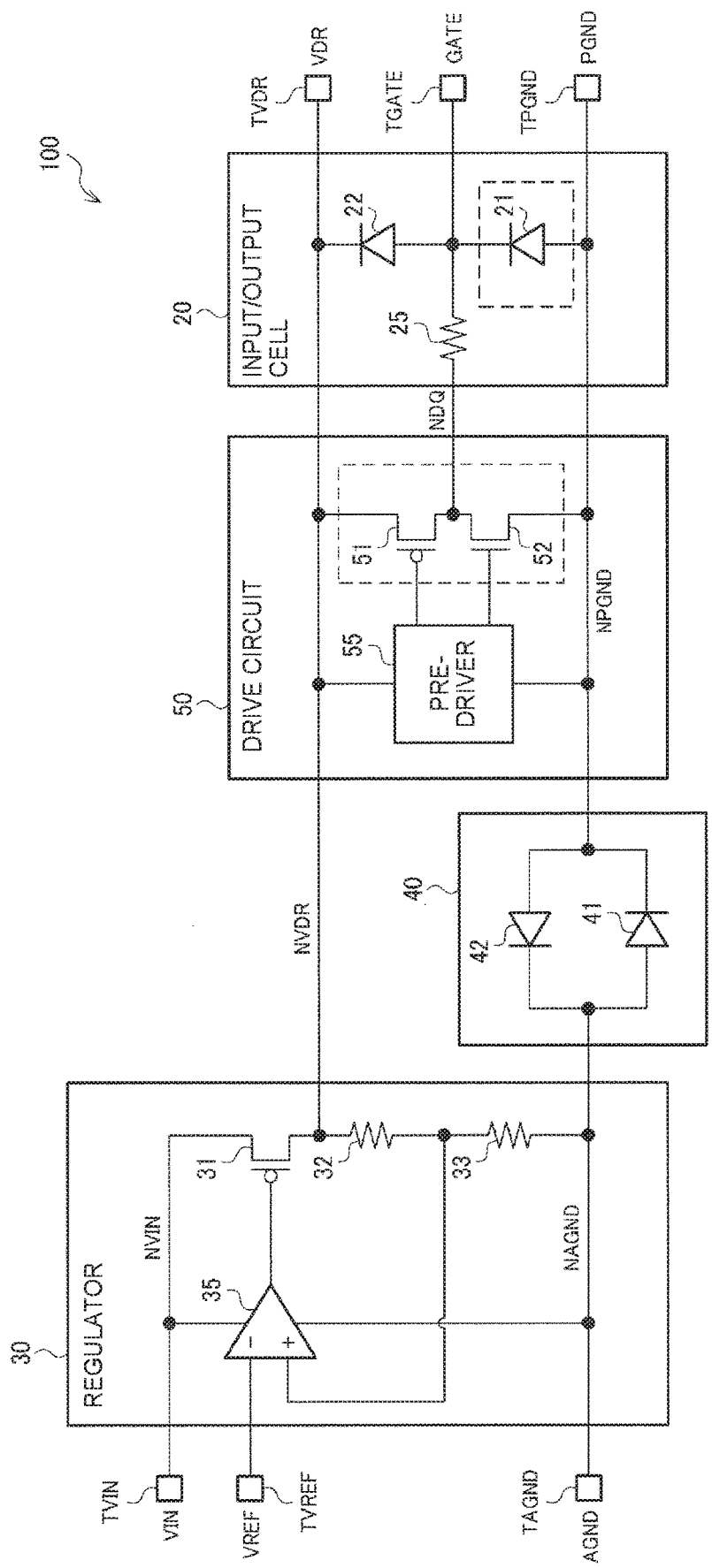
FIG. 1 shows an exemplary configuration of a circuit device of a present embodiment.

FIG. 1 shows an exemplary configuration of a circuit device 100 of the present embodiment. Note that FIG. 1 shows an example of the circuit configuration of the circuit device 100, and the circuit configuration of the circuit device 100 is not limited to that shown in FIG. 1. That is, the circuit device 100 need only include a first N-type well, a first P-type well, a first circuit element, a second N-type well, a second P-type well, and a second circuit element, which will be described later with reference to FIG. 5 and the like.

The circuit device 100 shown in FIG. 1 includes a drive circuit 50, an input/output cell 20, a regulator 30, a bidirectional diode 40, terminals TVIN, TVREF, TAGND, TVDR, and TPGND, and an output terminal TGATE. The circuit device 100 is an integrated circuit device called an IC (Integrated Circuit). The circuit device 100 is an IC manufactured by a semiconductor process, and is a semiconductor chip in which circuit elements are formed on a semiconductor substrate. The terminals of the circuit device 100 are terminals for electrically connecting the circuit device 100 and devices outside the circuit device 100, and are pads of a semiconductor chip, for example.

A ground power supply voltage PGND is supplied to the terminal TPGND from the outside of the circuit device 100, and a ground power supply voltage AGND is supplied to the terminal TAGND from the outside of the circuit device 100. The ground power supply voltage AGND is a ground power supply voltage that is different from the ground power supply voltage PGND. Specifically, a first ground power supply line connected to the terminal TAGND and a second ground power supply line connected to the terminal TPGND is not directly connected, being directly connected meaning being connected with no circuit element interposed therebetween, inside the circuit device 100, and are isolated to each other inside the circuit device 100. That is, the first ground power supply line and the second ground power supply line are not connected inside the circuit device 100, or are electrically connected via a coupling circuit. In FIG. 1, a ground node NAGND corresponds to the first ground power supply line, and a ground node NPGND corresponds to the second ground power supply line. FIG. 1 illustrates an example in which the first ground power supply line and the second ground power supply line are electrically connected through a bidirectional diode 40, which is a coupling circuit.

A power supply voltage VDR is supplied to the drive circuit 50 as a high potential-side power supply voltage, and the ground power supply voltage PGND is supplied thereto as a low potential-side power supply voltage. The drive circuit 50 drives a circuit element outside the circuit device 100 by outputting an output signal GATE to the circuit element from the output terminal TGATE. The drive circuit 50 includes a P-type transistor 51, an N-type transistor 52, and a predriver 55.

A source of the P-type transistor 51 is connected to a power supply node NVDR to which the power supply voltage VDR is supplied, and a drain thereof is connected to an output node NDQ of the drive circuit 50. A source of the N-type transistor 52 is connected to the ground node NPGND, and a drain thereof is connected to the output node NDQ. The ground node NPGND is connected to the terminal TPGND. As a result of the predriver 55 driving a gate of the P-type transistor 51 and a gate of the N-type transistor 52, the P-type transistor 51 and the N-type transistor 52 outputs the output signal GATE.

The input/output cell 20 is an electrostatic protection circuit for protecting circuits in the circuit device 100 from ESD (Electro Static Discharge). The input/output cell 20 includes protection diodes 21 and 22 and a resistor 25.

One end of the resistor 25 is connected to the output node NDQ of the drive circuit 50, and the other end is connected to the output terminal TGATE. An anode of the protection diode 21 is connected to the ground node NPGND, a cathode of the protection diode 21 and an anode of the protection diode 22 are connected to the output terminal TGATE, and a cathode of the protection diode 22 is connected to the power supply node NVDR.

The bidirectional diode 40 is provided between the ground node NAGND and the ground node NPGND in order to keep the potential difference between the ground power supply voltages AGND and PGND at a predetermined value or less. The ground node NAGND is connected to the terminal TAGND. The bidirectional diode 40 includes diodes 41 and 42.

An anode of the diode 41 and a cathode of the diode 42 are connected to the ground node NAGND, and a cathode of the diode 41 and an anode of the diode 42 are connected to the ground node NPGND.

The regulator 30 generates the power supply voltage VDR from an input power supply voltage VIN with the potential of the ground power supply voltage AGND being the reference. The input power supply voltage VIN is input to the terminal TVIN from the outside of the circuit device 100, and the potential thereof is higher than the potential of the power supply voltage VDR. Specifically, the regulator 30 includes a P-type transistor 31, resistors 32 and 33, and an operational amplifier 35.

The input power supply voltage VIN is supplied to the operational amplifier 35 as a high potential-side power supply voltage, and the ground power supply voltage AGND is supplied thereto as a low potential-side power supply voltage. A reference voltage VREF is input to an inverting input node of the operational amplifier 35. The reference voltage VREF is input to the terminal TVREF from the outside of the circuit device 100. Alternatively, the reference voltage VREF may be generated in the circuit device 100. A source of the P-type transistor 31 is connected to a power supply node NVIN to which the input power supply voltage VIN is supplied, and a drain thereof is connected to the power supply node NVDR. One end of the resistor 32 is connected to the power supply node NVDR, and the other end is connected to one end of the resistor 33 and a non-inverting input node of the operational amplifier 35. The other end of the resistor 33 is connected to the ground node NAGND.

Figure 2:
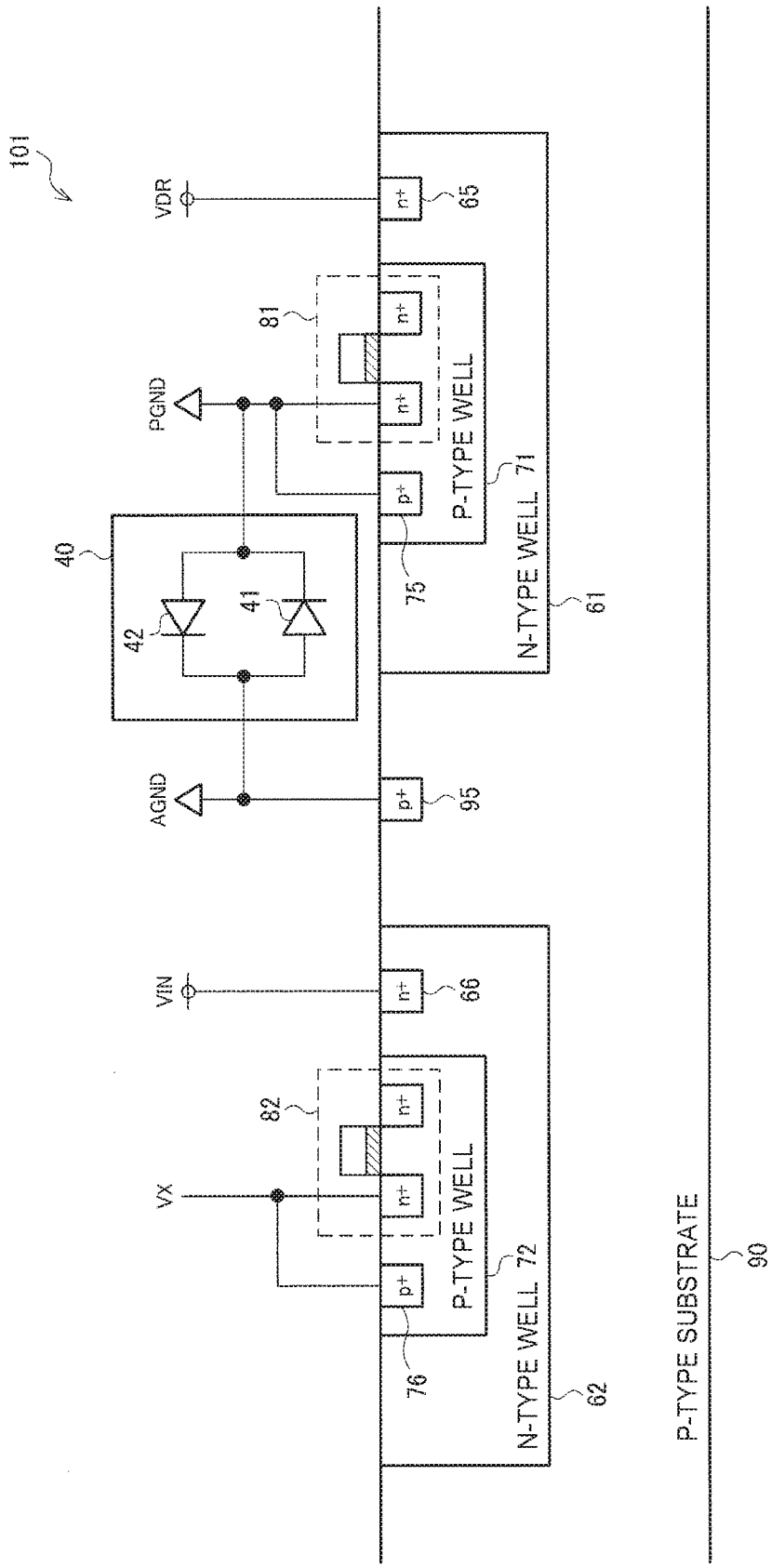
FIG. 2 is a first cross-sectional view of a semiconductor substrate of the circuit device when a high potential-side power supply voltage is supplied to an N-type well.

2. Case where Potential of N-Type Well is Set to Potential of High Potential-Side Power Supply Voltage Hereinafter, problems relating to the potential setting of the N-type well will be described. A first cross-sectional view of a semiconductor substrate of a circuit device 101 when a high potential-side power supply voltage is supplied to the N-type well is shown in FIG. 2. The circuit device 101 is configured similarly to the circuit device 100 shown in FIG. 1, and some of the constituent elements of the circuit device 101 are shown in FIG. 2. Note that a "p$^+$ impurity region" and an "n$^+$ impurity region" are also referred to as a P-type impurity region and an N-type impurity region.

The circuit device 101 includes a P-type substrate 90, N-type wells 61 and 62 in the P-type substrate 90, a P-type well 71 provided in the N-type well 61, a P-type well 72 provided in the N-type well 62, an N-type transistor 81 provided in the P-type well 71, and an N-type transistor 82 provided in the P-type well 72.

A well is a region where impurities are injected into the P-type substrate 90, and that is provided under circuit elements or another well. For example, a well is an impurity region that is provided so as to cover circuit elements or another well. The well is not limited to a well constituted by one impurity region, and may be a well in which a plurality of impurity regions are combined. For example, the well may be constituted by a buried layer and an impurity region that extends from a substrate surface to the buried layer.

The potential of the P-type substrate 90 is set to the potential of the ground power supply voltage AGND through a p$^+$ impurity region 95. The potential of the N-type well 61 is set to the potential of the power supply voltage VDR through an n$^+$ impurity region 65. The potential of the N-type well 62 is set to the potential of the input power supply voltage VIN through an n$^+$ impurity region 66. That is, the N-type transistor 81 is an N-type transistor included in a circuit that operates with the power supply voltage VDR, and the N-type transistor 82 is an N-type transistor included in a circuit that operates with the input power supply voltage VIN. Specifically, the N-type transistor included in the drive circuit 50 shown in FIG. 1 is envisioned as the N-type transistor 81. An N-type transistor included in the operational amplifier 35 shown in FIG. 1 is envisioned as the N-type transistor 82. Note that the circuit elements on the P-type wells 71 and 72 are not limited to N-type transistors, and may include a diode, resistor, and a capacitor, for example. In the following, a case where the circuit elements on the P-type wells 71 and 72 are N-type transistors will be described as an example.

The potentials of the P-type well 71 and a source of the N-type transistor 81 are set to the potential of the ground power supply voltage PGND. The potential of the P-type well 71 is set to the potential of the ground power supply voltage PGND through a p+ impurity region 75. The potentials of the P-type well 72 and a source of the N-type transistor 82 are set to a potential VX of a power supply voltage that is different from the ground power supply voltage PGND. The potential of the P-type well 72 is set to the potential VX through a p+ impurity region 76. The potential VX is the potential of the ground power supply voltage AGND, for example. Alternatively, the potential VX may also be a potential between the ground power supply voltage AGND and the input power supply voltage VIN.

As described above, as a result of the P-type wells 71 and 72 are isolated from the P-type substrate 90 by the N-type wells 61 and 62, the potentials of the P-type wells 71 and 72 can be set to potentials of power supply voltages that are different to each other. However, when the potentials of the N-type wells 61 and 62 are set to potentials of high potential-side power supply voltages, as shown in FIG. 2, there is a risk that element breakdown or an unexpected current leakage may occur. In the following, this point will be described.

Figure 3:
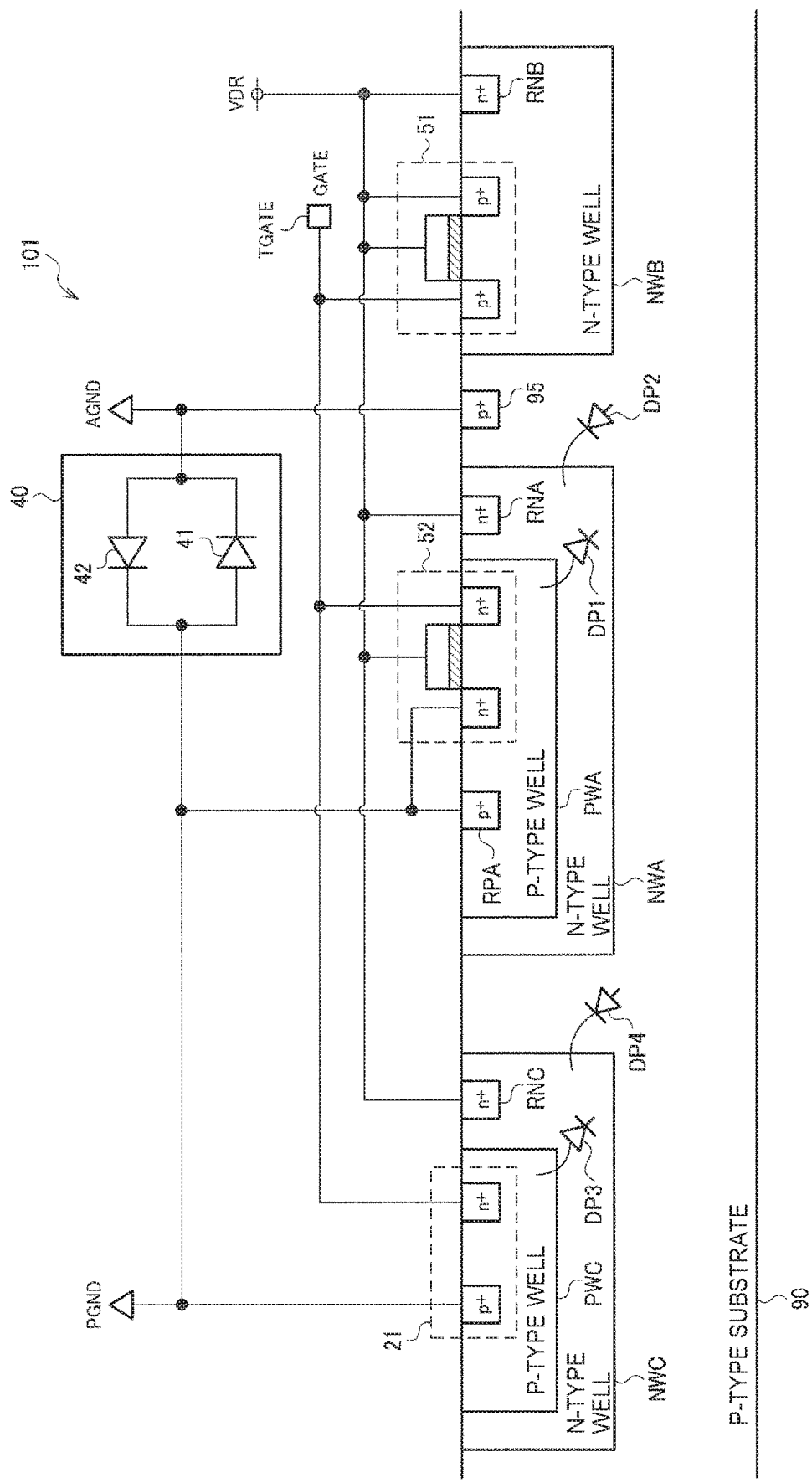
FIG. 3 is a second cross-sectional view of the semiconductor substrate of the circuit device when the high potential-side power supply voltage is supplied to the N-type well.
Figure 4:
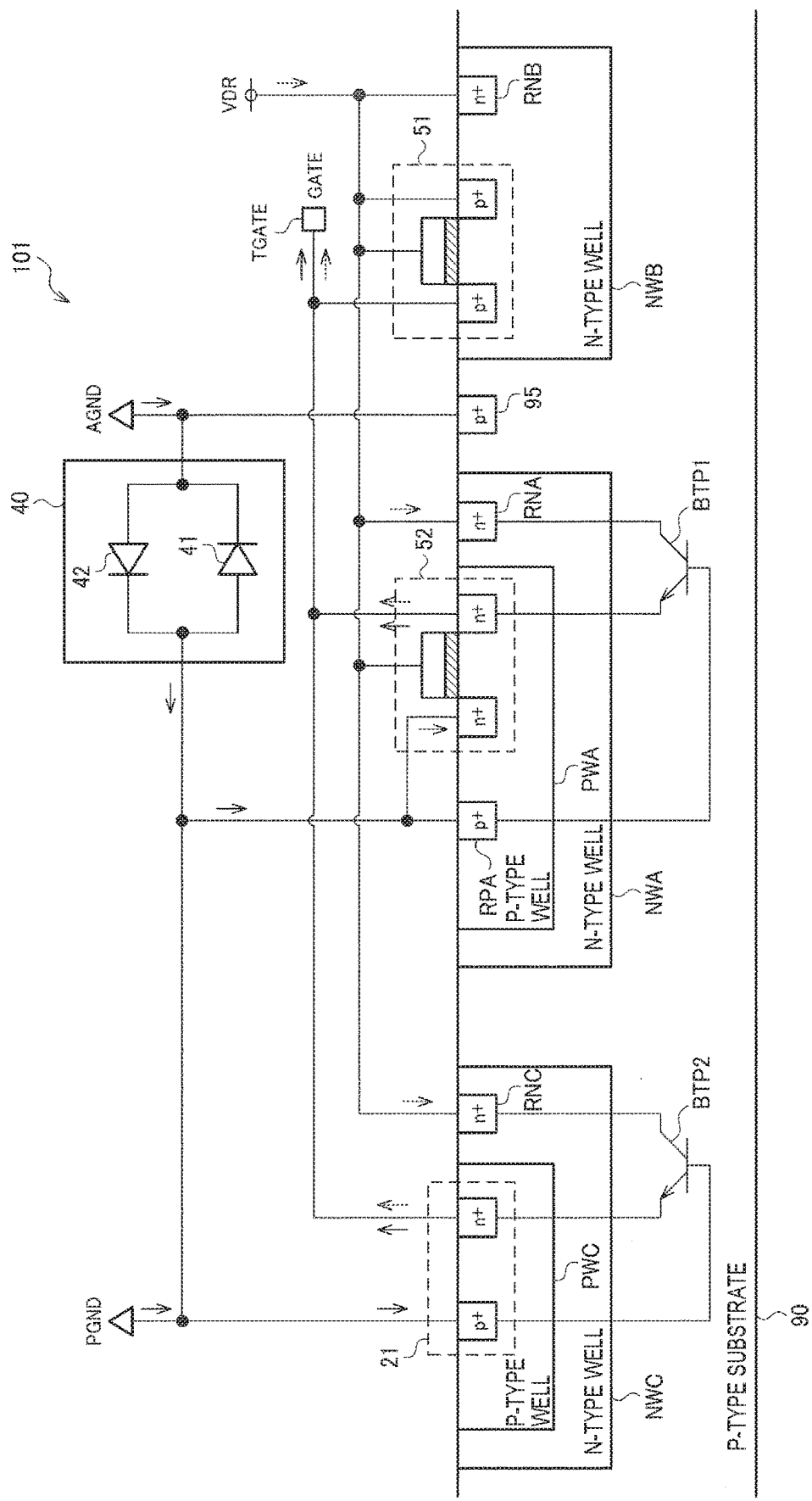
FIG. 4 is the second cross-sectional view of the semiconductor substrate of the circuit device when the high potential-side power supply voltage is supplied to the N-type well.

FIGS. 3 and 4 show a second cross-sectional view of the semiconductor substrate of the circuit device 101. The protection diode 21, the P-type transistor 51, and the N-type transistor 52, of the constituent elements of the circuit device 101, are shown in FIGS. 3 and 4. The configuration is the same between FIG. 3 and FIG. 4. First, a description will be given using FIG. 3.

The circuit device 101 shown in FIG. 3 includes the P-type substrate 90, N-type wells NWA to NWC that are provided in the P-type substrate 90, a P-type well PWA provided in the N-type well NWA, and a P-type well PWC provided in the N-type well NWC. Also, the circuit device 101 includes the N-type transistor 52 provided on the P-type well PWA, the P-type transistor 51 provided on the N-type well NWB, and the protection diode 21 provided on the P-type well PWC.

Note that, in FIG. 3, illustration of the cross sectional structure regarding the N-type transistor 82 in FIG. 2 is omitted. With respect to the N-type transistor 81, the N-type well 61 and the P-type well 71 in FIG. 2 correspond to the N-type well NWA and the P-type well PWA, or the N-type well NWC and the P-type well PWC in FIG. 3. In the latter case, the circuit element on the P-type well is a diode.

As shown in FIG. 3, a parasitic diode DP1 is formed between the P-type well PWA and the N-type well NWA, and a parasitic diode DP2 is formed between the P-type substrate 90 and the N-type well NWA. The potential of the P-type well PWA is set to the potential of the ground power supply voltage PGND through a p+ impurity region RPA, the potential of the N-type well NWA is set to the potential of the power supply voltage VDR through an n+ impurity region RNA, and the potential of the P-type substrate 90 is set to the potential of the ground power supply voltage AGND through the p+ impurity region 95. Therefore, voltages corresponding to potential differences between the power supply voltage VDR and the ground power supply voltages are respectively applied to the parasitic diodes DP1 and DP2 as reverse voltages.

Similarly, a parasitic diode DP3 is formed between the P-type well PWC and the N-type well NWC, and a parasitic diode DP4 is formed between the P-type substrate 90 and the N-type well NWC. The potential of the P-type well PWC is set to the potential of the ground power supply voltage PGND through a p+ impurity region of the protection diode 21, the potential of the N-type well NWC is set to the potential of the power supply voltage VDR through an n+ impurity region RNC, and the potential of the P-type substrate 90 is set to the potential of the ground power supply voltage AGND through the p+ impurity region 95. Therefore, voltages corresponding to potential differences between the power supply voltage VDR and the ground power supply voltages are respectively applied to the parasitic diodes DP3 and DP4 as reverse voltages.

As described above, when a high potential-side power supply voltage is applied to N-type wells, since reverse voltages are applied to the parasitic diodes DP1 to DP4, there is a risk that when one or more of the reverse voltages exceeds the respective break down voltages of the parasitic diode DP1 to DP4, an element or elements may be broken down. Therefore, this fact need to be considered in circuit design or layout design such that elements will not be broken down, and as a result, the complexity of the circuit design or layout design increases.

FIG. 4 illustrates a current path when a negative potential that is lower than the potential of the ground power supply voltage PGND is applied to the output terminal TGATE. The cross sectional structure is similar to that in FIG. 3, and therefore the description thereof is omitted. For example, a case is envisioned where a negative potential is applied to the output terminal TGATE due to noise, static electricity, or a short circuit. Alternatively, it is envisioned that a negative potential is applied to the output terminal TGATE in a latch-up test of the circuit device 100. It is assumed that the gate of the P-type transistor 51 and the gate of the N-type transistor 52 are driven to the potential of the power supply voltage VDR by the predriver 55, the P-type transistor 51 is in an off state and the N-type transistor 52 is in an on state.

As shown in FIG. 4, when a negative potential is applied to the output terminal TGATE, a first current path indicated by solid-line arrows, and a second current path indicated by dotted-line arrows are formed. In the first current path, currents flow from the ground power supply voltages AGND and PGND to the output terminal TGATE. Specifically, the P-type well PWC to which the ground power supply voltage PGND is supplied is an anode of the protection diode 21, an n+ impurity region provided in the P-type well PWC is a cathode of the protection diode 21, and the cathode is connected to the output terminal TGATE. Therefore, currents flow from the ground power supply voltages AGND and PGND to the output terminal TGATE through the protection diode 21. Also, since the N-type transistor 52 is in an on state, currents flow from the ground power supply voltages AGND and PGND to the output terminal TGATE through the N-type transistor 52. This first current path is usually envisioned, in design or the like, as a current path when a negative potential is applied to the output terminal TGATE.

In the second current path, a current flows from the power supply voltage VDR to the output terminal TGATE. Specifically, the N-type well NWA, the P-type well PWA, and the drain of the N-type transistor 52 constitute an NPN-type parasitic bipolar transistor BTP1. The P-type well PWA, which functions as a base, is at the potential of the ground power supply voltage PGND, and the drain of the N-type transistor 52, which functions as an emitter, is at a negative potential, and therefore the parasitic bipolar transistor BTP1 is turned on. With this, a current flows from the power supply voltage VDR to the output terminal TGATE through the collector and emitter of the parasitic bipolar transistor BTP1. Also, the N-type well NWC, the n+ impurity region of the protection diode 21, and the P-type well PWC constitute an NPN-type parasitic bipolar transistor BTP2. The P-type well PWC, which functions as a base, is at the potential of the ground power supply voltage PGND, and the n+ impurity region of the protection diode 21, which functions as an emitter, is at a negative potential, and therefore the parasitic bipolar transistor BTP2 is turned on. With this, a current flows from the power supply voltage VDR to the output terminal TGATE through the collector and emitter of the parasitic bipolar transistor BTP2.

The second current path is a path that is not usually envisioned, in design or the like, as a current path when a negative potential is applied to the output terminal TGATE, and therefore there is a risk that an unexpected leak current flows in the path. This leak current may incur an adverse effect to the circuit device 100 such as heat generation. Specifically, as described with reference to FIG. 1, the regulator 30 generates the power supply voltage VDR from the input power supply voltage VIN. Therefore, the current that flows from the power supply voltage VDR to the output terminal TGATE incurs a current that flows from the input power supply voltage VIN to the power supply node NVDR via the regulator 30. In FIG. 1, this current flows through the P-type transistor 31, and therefore it is possible that the P-type transistor 31 generates heat and fails.

The input power supply voltage VIN is at a higher potential than the power supply voltage VDR, and therefore, when a power loss of potential×current is considered, the power loss with the input power supply voltage VIN is larger than the power loss with the power supply voltage VDR. Therefore, the generated heat increases as the input power supply voltage VIN increases. For example, as will be described later with reference to FIG. 9 or the like, a light source circuit that drives a laser diode or the like is envisioned as an application example of the circuit device 100. When a plurality of laser diodes are connected in series in order to increase the light amount, the input power supply voltage VIN needs to be increased in order to deal with the voltage drops in the laser diodes. Therefore, the power loss when a leak current flows from the input power supply voltage VIN increases, and the generated heat increases.

3. Exemplary Cross Sectional Structure of Present Embodiment

Figure 5:
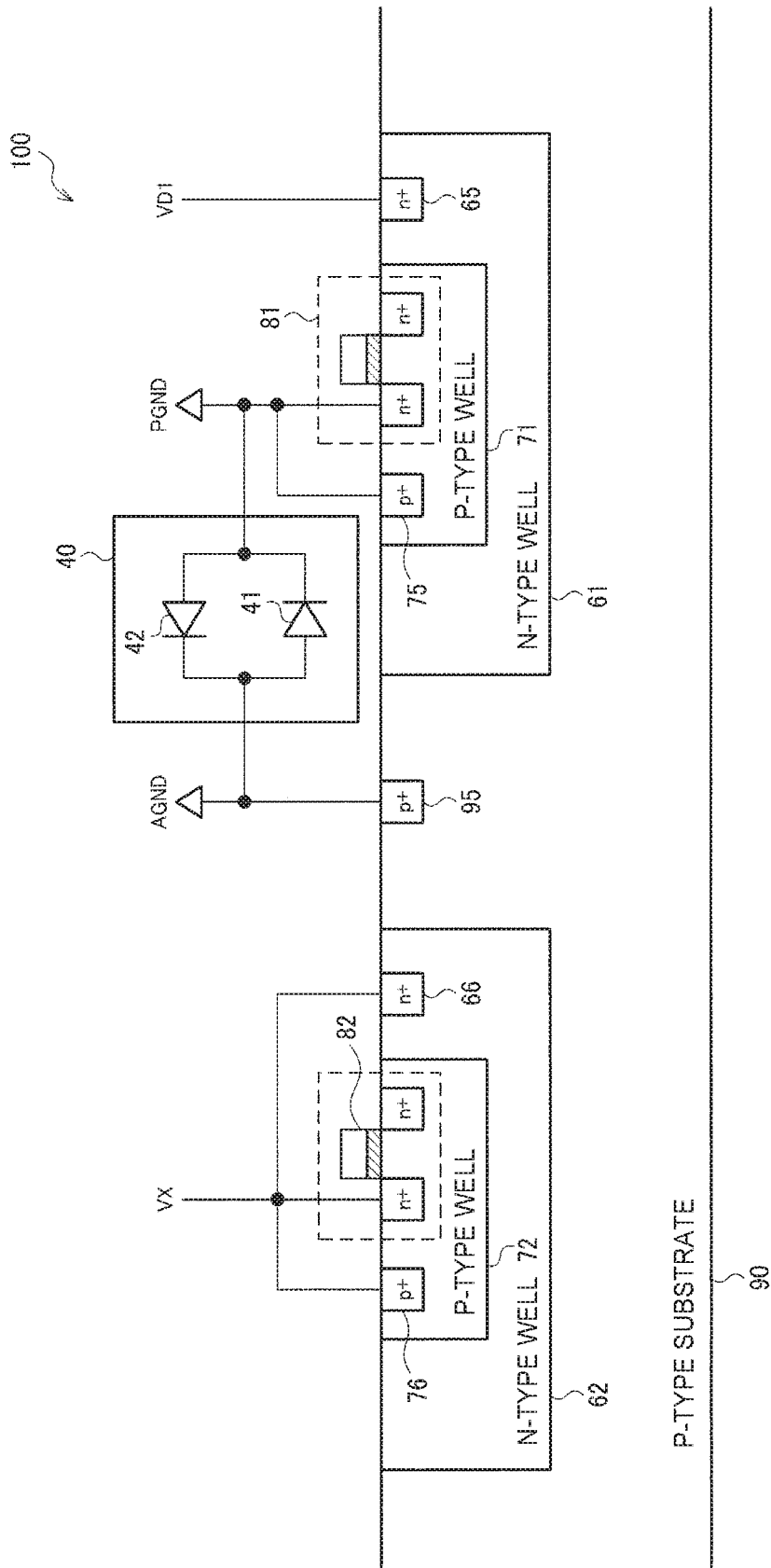
FIG. 5 is a first cross-sectional view of the semiconductor substrate of the circuit device of the present embodiment.

FIG. 5 is a first cross-sectional view of the semiconductor substrate of the circuit device 100 in the present embodiment. The circuit device 100 is configured as illustrated in FIG. 1, and some of the constituent elements of the circuit device 100 are shown in FIG. 2. Note that the constituent elements that are the same as the constituent elements that have been already described are given the same reference signs, and the description of the constituent elements will be appropriately omitted.

The circuit device 100 includes the P-type substrate 90, the N-type well 61, which is the first N-type well, the N-type well 62, which is the second N-type well, the P-type well 71, which is the first P-type well, the P-type well 72, which is the second P-type well, the N-type transistor 81, which is the first circuit element, and the N-type transistor 82, which is the second circuit element. The ground power supply voltage PGND is a first ground power supply voltage, and the ground power supply voltage AGND is a second ground power supply voltage. Note that the first circuit element and the second circuit element are not limited to the N-type transistors, and may also be diodes, resistors, or capacitors.

In FIG. 2, the power supply voltage VDR is supplied to the N-type well 61, but in the present embodiment, a first potential VD1 is supplied to the N-type well 61. The first potential VD1 is a potential that is greater than or equal to the potential of the ground power supply voltage PGND and is less than the potential of the power supply voltage VDR. The power supply voltage VDR is a high potential-side power supply voltage when the ground power supply voltage PGND is a low potential-side power supply voltage. The first potential VD1 is supplied from a node at a power supply voltage that is not electrically connected to a node at the power supply voltage VDR. Being "not electrically connected" means being not electrically connected at least in the circuit device 100. Specifically, the "power supply voltage at a node that is not electrically connected to a node at the power supply voltage VDR" is a power supply voltage that is supplied by a power supply line that is not electrically connected to the power supply line of the power supply voltage VDR. More specifically, the power supply voltage VDR is generated from the input power supply voltage VIN, as described in FIG. 1, but the "power supply voltage at a node that is not electrically connected to a node at the power supply voltage VDR" is a power supply voltage that is not generated from the input power supply voltage VIN. For example, the power supply voltage is a power supply voltage supplied from the outside of the circuit device 100 separately from the input power supply voltage VIN, or a power supply voltage generated from the power supply voltage supplied from the outside.

In this way, the potential of the N-type well 61 can be set to an appropriate potential. That is, the power supply voltage VDR is no longer supplied to the N-type well 61, and therefore element breakdown or an unexpected leak current can be suppressed from occurring. This point will be described using FIG. 6.

Figure 6:
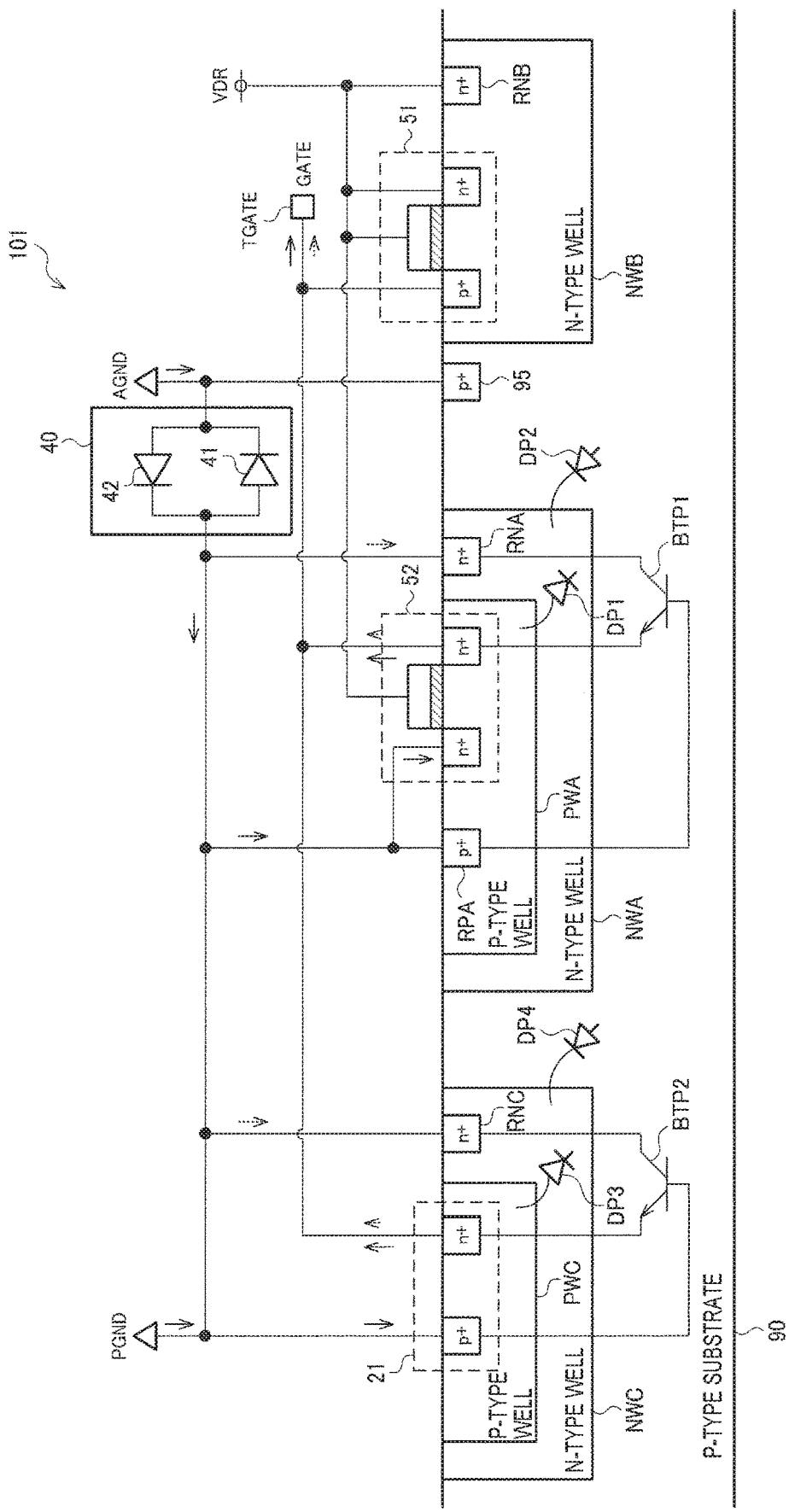
FIG. 6 is a second cross-sectional view of the semiconductor substrate of the circuit device of the present embodiment.

FIG. 6 is a second cross-sectional view of the semiconductor substrate of the circuit device 100. The protection diode 21, the P-type transistor 51, and the N-type transistor 52, of the constituent elements of the circuit device 100, are shown in FIG. 6. Note that the constituent elements that are the same as the constituent elements that have been already described are given the same reference signs, and the description of the constituent elements will be appropriately omitted.

The circuit device 100 includes the P-type substrate 90, the N-type wells NWA, NWB, and NWC, the P-type wells PWA and PWC, the N-type transistor 52, the P-type transistor 51, and the protection diode 21. The N-type well 61 and the P-type well 71 in FIG. 5 correspond to the N-type well NWA and the P-type well PWA, or the N-type well NWC and the P-type well PWC in FIG. 6. The N-type well NWB is a third N-type well, and the P-type transistor 51 is a third circuit element. Note that, in FIG. 6, the first potential VD1 is a potential of the ground power supply voltage PGND.

As shown in FIG. 6, the potentials of the P-type well PWA and the N-type well NWA are set to the potential of the ground power supply voltage PGND, and therefore reverse voltages are not applied to the parasitic diodes DP1 and DP2. Similarly, the potentials of the P-type well PWC, the N-type well NWC, and the P-type substrate 90 are set to the potential of the ground power supply voltage PGND, and therefore reverse voltages are not applied to the parasitic diodes DP3 and DP4. Therefore, the break down voltages of the parasitic diode DP1 to DP4 need not be taken into consideration when circuit design or layout design is performed, and as a result, the circuit design or the layout design can be simplified.

Also, as shown in FIG. 6, the potentials of the N-type well NWA, which is a collector of the parasitic bipolar transistor BTP1, and the N-type well NWC, which is a collector of the parasitic bipolar transistor BTP2 are set to the potential of the ground power supply voltage PGND. Therefore, when a negative potential is applied to the output terminal TGATE, currents flow from the ground power supply voltages AGND and PGND to the output terminal TGATE through the parasitic bipolar transistors BTP1 and BTP2. That is, nodes at the ground power supply voltages AGND and PGND are on upstream of the second current path described with reference to FIG. 4, and therefore, when a negative potential is applied to the output terminal TGATE, an unexpected leak current does not flow from a node at the power supply voltage VDR. With this, when a negative potential is applied to the output terminal TGATE, the power loss due to a leak current can be suppressed, and a circuit failure due to heat generation or the like can be suppressed.

Note that, as shown in FIG. 5, in the present embodiment, the potential of the N-type well 62 may be set to the potential VX. With this, a reverse voltage is no longer applied to a parasitic diode that is formed between the P-type well 72 and the N-type well 62, and therefore elements can be suppressed from being broken down. Also, when the potential VX is the potential of the ground power supply voltage AGND, a reverse voltage is no longer applied to a parasitic diode that is formed between the P-type substrate 90 and the N-type well 62, and therefore elements can be suppressed from being broken down. Also, when the potential VX is a potential between the ground power supply voltage AGND and the input power supply voltage VIN, the reverse voltage of the parasitic diode decreases relative to the case where the potential of the N-type well 62 is set to the potential of the input power supply voltage VIN, and therefore the possibility of element breakdown can be reduced.

Figure 7:
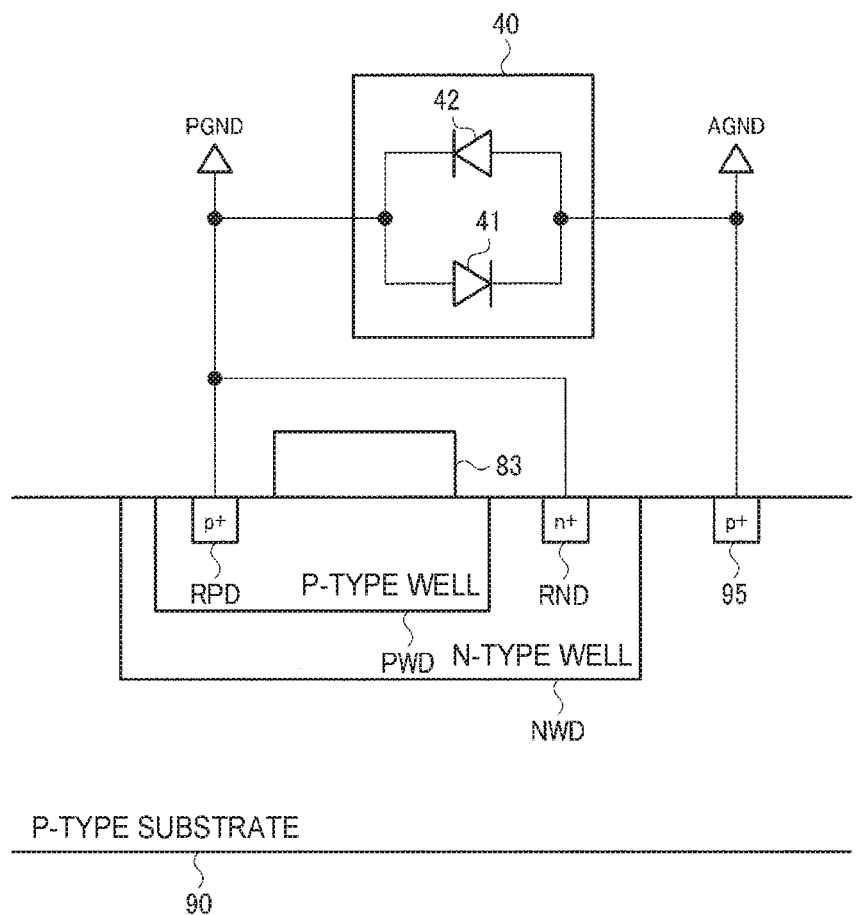
FIG. 7 is a cross-sectional view of an exemplary configuration of modification of a first circuit element.

Note that, the first circuit element is an N-type transistor in FIG. 5, and the first circuit element is an N-type transistor or a protection diode in FIG. 6, but the first circuit element is not limited thereto. FIG. 7 is a cross-sectional view of an exemplary configuration of modification of the first circuit element.

As shown in FIG. 7, an N-type well NWD is provided in the P-type substrate 90, a P-type well PWD is provided in the N-type well NWD, and a first circuit element 83 is provided in the P-type well PWD. The potential of the N-type well NWD is set to the potential of the ground power supply voltage PGND through an n$^+$ impurity region RND, and the potential of the P-type well PWD is set to the potential of the ground power supply voltage PGND through a p$^+$ impurity region RPD. The first circuit element 83 is a polysilicon resistor formed on the P-type well PWD, a capacitor whose electrodes include an electrode formed by a polysilicon layer formed on the P-type well PWD, or the like.

In the configuration shown in FIG. 7 as well, although parasitic diodes similar to the parasitic diodes DP1 to DP4 in FIG. 6 are formed, because the ground power supply voltage PGND is supplied to the N-type well NWD, reverse voltages are not applied to the parasitic diodes. With this, element breakdown can be suppressed. Note that the first potential VD1 described in FIG. 5 may be supplied to the N-type well NWD.

4. Detailed Exemplary Configuration

Figure 8:
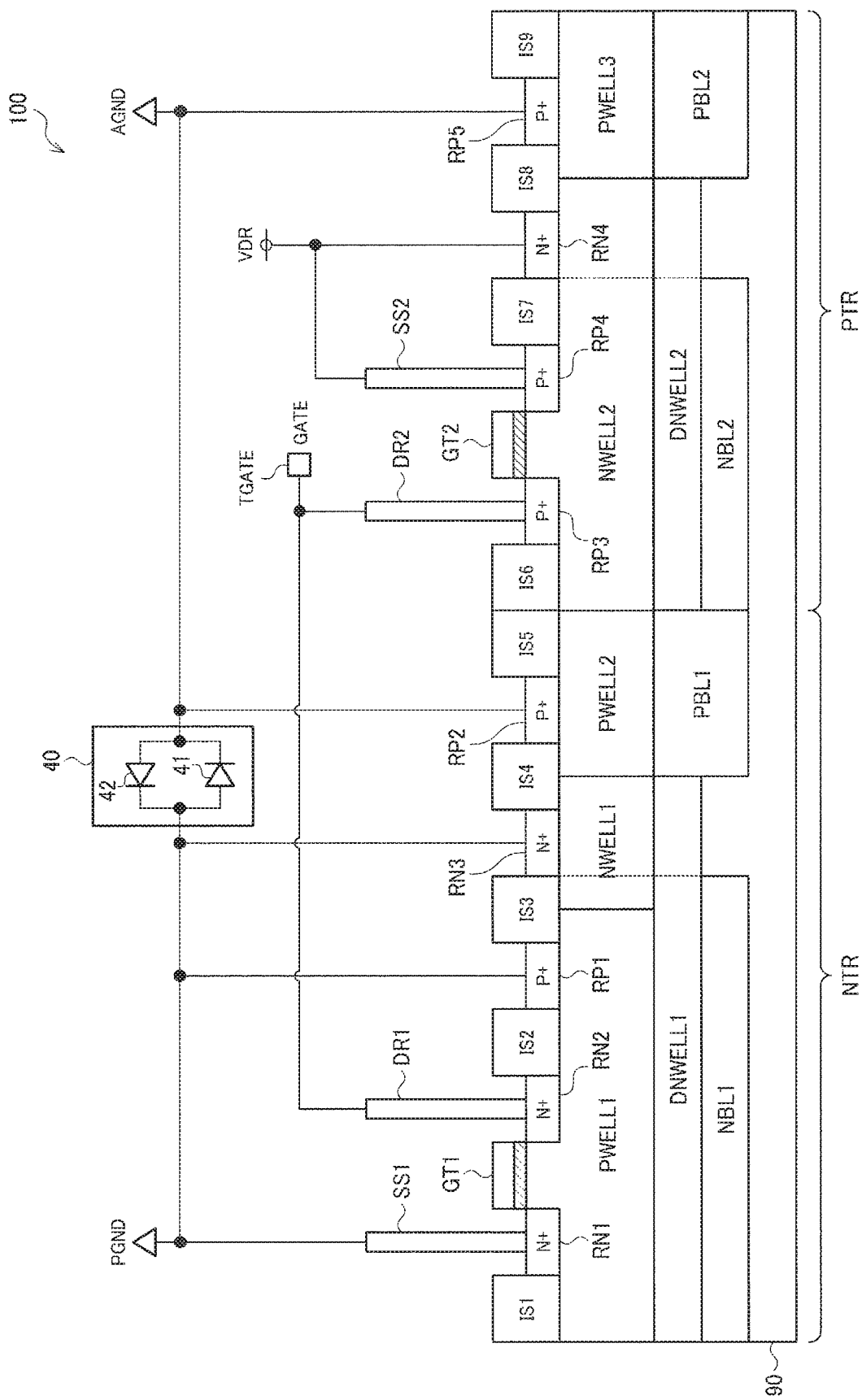
FIG. 8 is a detailed cross-sectional view of the semiconductor substrate of the present embodiment.

FIG. 8 is a detailed cross-sectional view of the semiconductor substrate in the present embodiment. Some of the constituent elements of the circuit device 100 are shown in FIG. 8. The circuit device 100 shown in FIG. 8 includes the P-type substrate 90, an N-type transistor NTR, and a P-type transistor PTR. Note that, in the present embodiment, "on" indicates a thickness direction of the semiconductor substrate and a direction in which films are stacked in the semiconductor process.

In the cross sectional structure of the N-type transistor NTR, an N-type buried layer NBL1 and a P-type buried layer PBL1 are provided on the P-type substrate 90. The buried layer is a layer that is buried in the substrate by forming an epitaxial layer on the layer. A deep N-type well DNWELL1 is provided on the N-type buried layer NBL1, and the N-type buried layer NBL1 is in contact with the deep N-type well DNWELL1. The deep well is a well provided under a P-type well or an N-type well. The deep N-type well DNWELL1 and the N-type buried layer NBL1 are provided in a region covering depths substantially the same as the P-type buried layer PBL1. The N-type buried layer NBL1 need not cover the entirety of the deep N-type well DNWELL1. That is, some of the deep N-type well DNWELL1 may be in contact with the P-type substrate 90.

A P-type well PWELL1 and an N-type well NWELL1 are provided on the deep N-type well DNWELL1, and the P-type well PWELL1 and the N-type well NWELL1 are in contact with the deep N-type well DNWELL1. A P-type well PWELL2 is provided on the P-type buried layer PBL1, and the P-type well PWELL2 is in contact with the P-type buried layer PBL1. The P-type well PWELL1 is in contact with the N-type well NWELL1, and the N-type well NWELL1 is in contact with the P-type well PWELL2.

N$^+$ impurity regions RN1 and RN2 and a P$^+$ impurity region RP1 are provided on the P-type well PWELL1, and these impurity regions reach surfaces of the P-type well PWELL1 and the P-type substrate 90. An N$^+$ impurity region RN3 is provided on the N-type well NWELL1, and the N$^+$ impurity region RN3 reaches the surfaces of the N-type well NWELL1 and the P-type substrate 90. A P$^+$ impurity region RP2 is provided on the P-type well PWELL2, and the P$^+$ impurity region RP2 reaches the surfaces of the P-type well PWELL2 and the P-type substrate 90. Insulating layers IS1 to IS5 are provided as insulating layers for isolating adjacent impurity regions.

The P-type well PWELL1 reaches the surface of the P-type substrate 90 in a region between the N$^+$ impurity regions RN1 and RN2, and a gate GT1 formed by a polysilicon layer is provided thereon. For example, a metal layer connected to the N$^+$ impurity region RN1 is a source SS1 of the N-type transistor NTR, and a metal layer connected to the N$^+$ impurity region RN2 is a drain DR1 of the N-type transistor NTR.

The P$^+$ impurity region RP2 is connected to a node at the ground power supply voltage AGND. With this, the potential of the P-type substrate 90 is set to the potential of the ground power supply voltage AGND through the P-type well PWELL2 and the P-type buried layer PBL1.

The potentials of the P$^+$ impurity region RP1 and the N$^+$ impurity region RN3 are set to the potential of the ground power supply voltage PGND. With this, the potentials of the P-type well PWELL1, the N-type well NWELL1, the deep N-type well DNWELL1, and the N-type buried layer NBL1 are set to the potential of the ground power supply voltage PGND. The N-type well NWELL1, the deep N-type well DNWELL1, and the N-type buried layer NBL1 correspond to the N-type well 61 in FIG. 5, and the N-type well NWA in FIG. 6.

In the cross sectional structure of the P-type transistor PTR, an N-type buried layer NBL2 and a P-type buried layer PBL2 are provided on the P-type substrate 90. A deep N-type well DNWELL2 is provided on the N-type buried layer NBL2, and the N-type buried layer NBL2 is in contact with the deep N-type well DNWELL2. The deep N-type well DNWELL2 and the N-type buried layer NBL2 are provided in a region covering depths substantially the same as the P-type buried layer PBL2. The N-type buried layer NBL2 need not cover the entirety of the deep N-type well DNWELL2. That is, some of the deep N-type well DNWELL2 may be in contact with the P-type substrate 90.

An N-type well NWELL2 is provided on the deep N-type well DNWELL2, and the N-type well NWELL2 is in contact with the deep N-type well DNWELL2. A P-type well PWELL3 is provided on the P-type buried layer PBL2, and the P-type well PWELL3 is in contact with the P-type buried layer PBL2. The N-type well NWELL3 is in contact with the P-type well PWELL3.

P⁺ impurity regions RP3 and RP4 and an N⁺ impurity region RN4 are provided on the N-type well NWELL2, and these impurity regions reach surfaces of the N-type well NWELL2 and the P-type substrate 90. A P⁺ impurity region RP5 is provided on the P-type well PWELL3, and the P⁺ impurity region RP5 reaches surfaces of P-type well PWELL3 and the P-type substrate 90. Insulating layers IS6 to IS9 are provided as insulating layers for isolating adjacent impurity regions.

The N-type well NWELL2 reaches the surface of the P-type substrate 90 in a region between the P⁺ impurity regions RP3 and RP4, and a gate GT2 formed by a polysilicon layer is provided thereon. For example, a metal layer connected to the P⁺ impurity region RP3 is a drain DR2 of the P-type transistor PTR, and a metal layer connected to the P⁺ impurity region RP4 is a source SS2 of the P-type transistor PTR.

The P⁺ impurity region RP5 is connected to the node at the ground power supply voltage AGND. With this, the potential of the P-type substrate 90 is set to the potential of the ground power supply voltage AGND through the P-type well PWELL3 and the P-type buried layer PBL2.

The potentials of the N⁺ impurity region RN4 is set to the potential of the power supply voltage VDR. With this, the potentials of the N-type well NWELL2, the deep N-type well DNWELL2, and the N-type buried layer NBL2 are set to the potential of the power supply voltage VDR. The N-type well NWELL2, the deep N-type well DNWELL2, and the N-type buried layer NBL2 correspond to the N-type well NWB in FIG. 6.

5. Light Source Device

Figure 9:
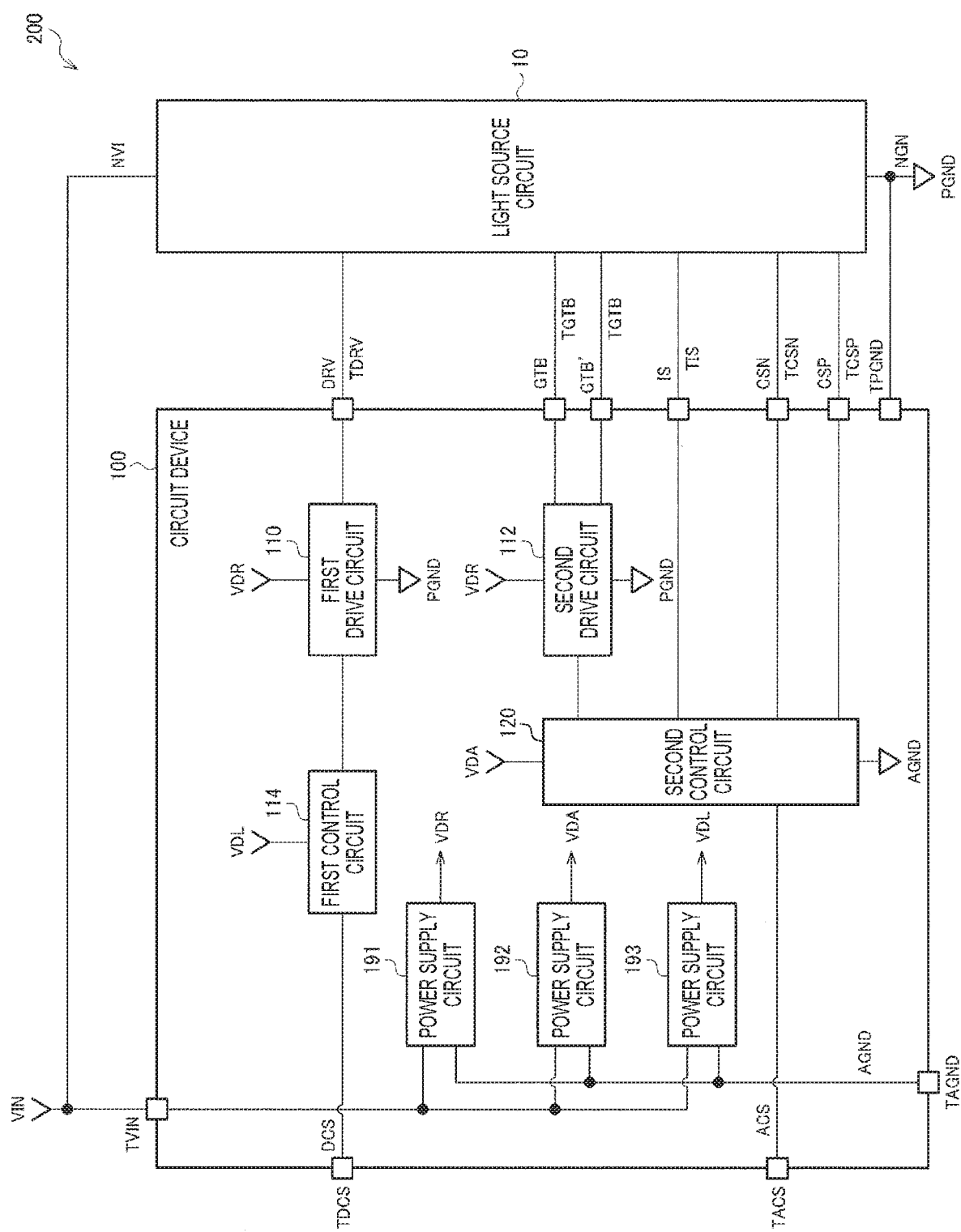
FIG. 9 shows a first exemplary configuration of a light source device.
Figure 13:
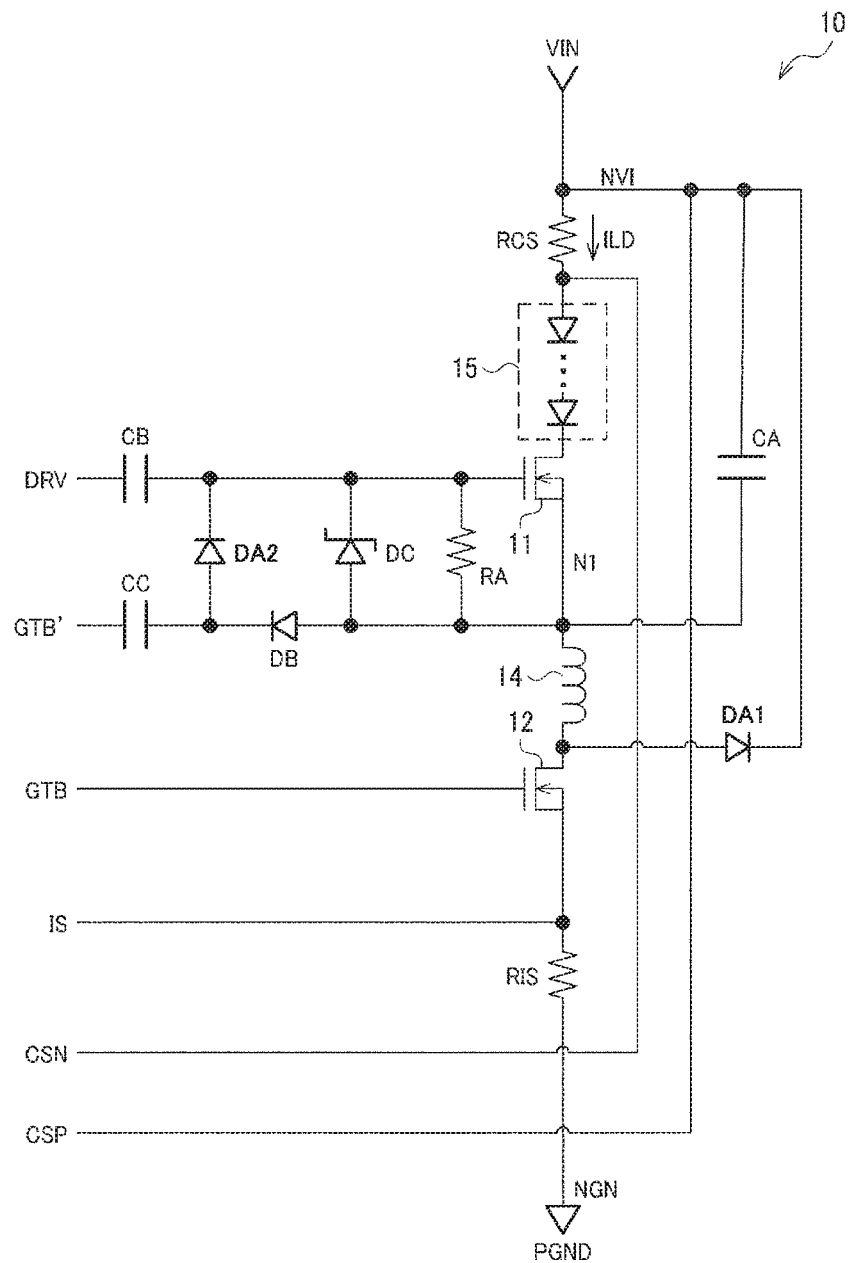
FIG. 13 shows an exemplary configuration of a light source circuit.

FIG. 9 shows a first exemplary configuration of a light source device 200 including the circuit device 100, and FIG. 13 shows an exemplary configuration of a light source circuit 10. The light source device 200 includes the circuit device 100 and the light source circuit 10. The circuit device 100 in the light source device 200 may also be referred to as a light emission control device.

The light source circuit 10 includes a first switching element 11, a second switching element 12, an inductor 14, and a light emitting element 15. Also, the light source circuit 10 includes a first resistor RCS, a second resistor RIS, a capacitor CA, and a diode DA1. The first switching element 11 and the second switching element 12 are N-type transistors.

The light emitting element 15 is driven by a current ILD, and emits light at a brightness corresponding to the current value of the current ILD. The light emitting element 15 is constituted by a plurality of laser diodes connected in series. Note that the light emitting element 15 may also be constituted by one laser diode, or an LED (Light Emitting Diode).

The light emitting element 15 and the first switching element 11 are provided in series between a first power supply node NVI and a first node N1. The first power supply node NVI is a node to which the input power supply voltage VIN is to be input. The first node N1 is a node that is connected to one end of the inductor 14. The inductor 14, the second switching element 12, and the second resistor RIS are provided in series between the first node N1 and a second power supply node NGN. The second power supply node NGN is a node to which the ground power supply voltage PGND is to be input. The capacitor CA is provided between the first power supply node NVI and the first node N1. The diode DA1 is provided between the first power supply node NVI and the other end of the inductor 14. Also, the light source circuit 10 may include capacitors CB and CC, a diode DA2, a diode DB, a Zener diode DC, and a resistor RA. These elements are provided in order to control the gate voltage of the first switching element 11.

The second switching element 12 is for controlling the current flowing through the inductor 14 through switching regulation. The first switching element 11 is for controlling whether or not the current flowing through the inductor 14 is allowed to flow through the light emitting element 15. A mode in which the first switching element 11 is continuously turned on, and the light emission amount of the light emitting element 15 is controlled by controlling the second switching element 12 through switching regulation is referred to as an analog light modulation mode. Also, a mode in which the first switching element 11 is repeatedly turned on and off, and the light emission amount of the light emitting element 15 is controlled by the on duty ratio is referred to as a PWM light modulation mode.

The circuit device 100 includes a first drive circuit 110, a second drive circuit 112, a first control circuit 114, a second control circuit 120, power supply circuits 191 to 193, a PWM terminal TDCS, a light modulation voltage input terminal TACS, and terminals TVIN, TDRV, TGTB, TGTB', TIS, TCSP, and TCSN. The first drive circuit 110 or the second drive circuit 112 corresponds to the drive circuit 50 in FIG. 1, the terminal TDRV, TGTB, or TGTB' corresponds to the output terminal TGATE in FIG. 1, and the power supply circuit 191 corresponds to the regulator 30 in FIG. 1.

The input power supply voltage VIN is input to the terminal TVIN from a power supply circuit provided outside the circuit device 100. The power supply circuit 191 converts the potential of the input power supply voltage VIN to the potential of the power supply voltage VDR, and supplies the power supply voltage VDR to the first drive circuit 110 and the second drive circuit 112. The power supply circuit 192 converts the potential of the input power supply voltage VIN to the potential of the power supply voltage VDL, and supplies the power supply voltage VDL to the first control circuit 114. The power supply circuit 193 converts the potential of the input power supply voltage VIN to the potential of the power supply voltage VDA, and supplies the power supply voltage VDA to the second control circuit 120. Each of the power supply circuits 191 to 193 is a regulator, and is a linear regulator using a non-inverting amplifier circuit, for example.

A PWM signal DCS to be used for light modulation control in the PWM light modulation mode is input to the PWM terminal TDCS from a processing device. A light modulation voltage ACS to be used for light modulation control in the analog light modulation mode is input to the light modulation voltage input terminal TACS from the processing device. The processing device is a host device of the circuit device 100, and is a processor such as an MPU or a CPU, for example.

The first control circuit 114 outputs a first control signal based on the PWM signal DCS. The first control circuit 114 is a logic circuit that operates with the power supply voltage VDL, and is a buffer circuit for buffering the PWM signal DCS, for example.

The first drive circuit 110 is a driver for driving the first switching element 11, and operates with the power supply voltage VDR. The first drive circuit 110 outputs the first drive signal DRV based on the first control signal from the first control circuit 114. The first drive signal DRV is a signal for controlling turning on and off of the first switching element 11. The first drive signal DRV is output from the terminal TDRV, and is input to a gate of the first switching element 11. The first drive circuit 110 outputs the first drive signal DRV for turning on the first switching element 11 when the PWM signal DCS is activated, and outputs the first drive signal DRV for turning off the first switching element 11 when the PWM signal DCS is inactivated.

The second control circuit 120 outputs a second control signal based on the light modulation voltage ACS and the PWM signal DCS. The second control circuit 120 is an analog circuit that operates with the power supply voltage VDA. The second control circuit 120 controls turning on and off of the second switching element 12 in a period in which the PWM signal DCS is activated. Specifically, a voltage CSP at one end of the first resistor RCS is input to the terminal TCSP, a voltage CSN at the other end of the first resistor RCS is input to the terminal TCSN, and a voltage IS of one end of the second resistor RIS is input to the terminal TIS. The second control circuit 120 controls the current ILD flowing through the light emitting element 15 so as to correspond to the light modulation voltage ACS by controlling the current ILD through switching regulation based on the voltages CSP, CSN, and IS and the light modulation voltage ACS.

The second drive circuit 112 is a driver for driving the second switching element 12, and operates with power supply voltage VDR. The second drive circuit 112 outputs a second drive signal GTB and a signal GTB' based on the second control signal from the second control circuit 120. The second drive signal GTB is a signal for controlling turning on and off of the second switching element 12. The second drive signal GTB is output from the terminal TGTB, and is input to a gate of the second switching element 12. The signal GTB' is output from the terminal TGTB'. The signal GTB' is a signal for controlling the gate voltage of the first switching element 11. The signal GTB' is a signal having the same waveform as the second drive signal GTB, for example, but may also be a signal having a different waveform from the second drive signal GTB.

Figure 10:
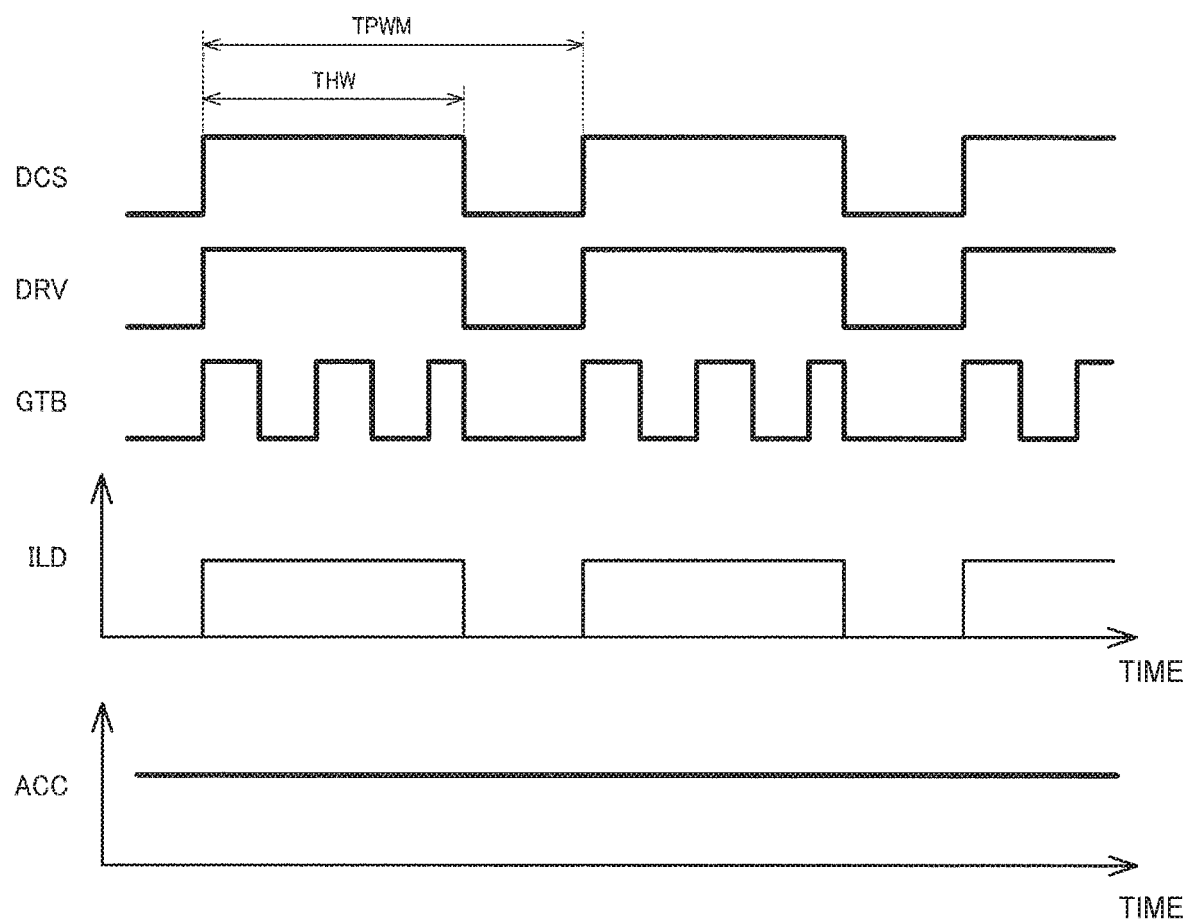
FIG. 10 is a waveform diagram in a PWM light modulation mode.

FIG. 10 is a waveform diagram in the PWM light modulation mode. The cycle of the PWM signal DCS is denoted by TPWM, and the period in which the PWM signal DCS is at a high level is denoted by THW. The duty ratio of the PWM signal DCS is (THW/TPWM)×100%.

When the PWM signal DCS is at a high level, the first drive circuit 110 outputs the first drive signal DRV at a high level. With this, the first switching element 11 is turned on. Here, the second control circuit 120 and the second drive circuit 112 perform the switching regulation control by switching the second switching element 12. With this, the current ILD corresponding to the light modulation voltage ACS flows through the light emitting element 15. When the PWM signal DCS is at a low level, the first drive circuit 110 outputs the first drive signal DRV at a low level. With this, the first switching element 11 is turned off. Also, the second control circuit 120 and the second drive circuit 112 turn off the second switching element 12. Here, current does not flow through the light emitting element 15.

The average over time of the current ILD flowing through the light emitting element 15 is determined by the duty ratio of the PWM signal DCS, and therefore the light emission amount is also determined by the duty ratio of the PWM signal DCS. As described above, in the PWM light modulation mode, light modulation control is performed using the duty ratio of the PWM signal DCS. In the analog light modulation mode, the PWM signal DCS that is continuously at a high level is input to the PWM terminal TDCS. The operations of the circuit device 100 in the analog light modulation mode is similar to those of the circuit device 100 when the PWM signal DCS is at a high level in the PWM light modulation mode. That is, in the analog light modulation mode, since the current ILD corresponding to the light modulation voltage ACS flows through the light emitting element 15, light modulation control is performed by the light modulation voltage ACS.

Figure 11:
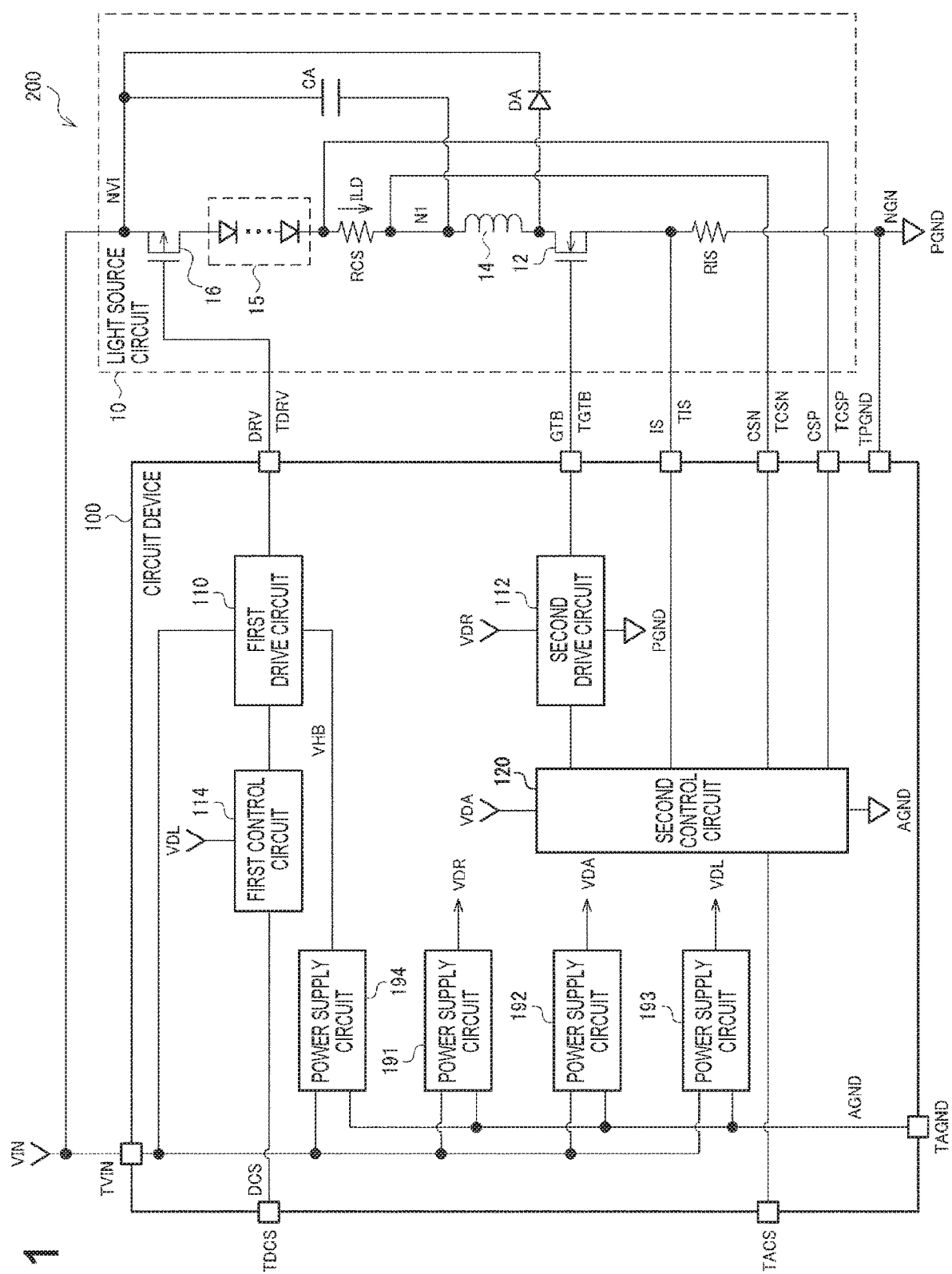
FIG. 11 shows a second exemplary configuration of the light source device.

FIG. 11 shows a second exemplary configuration of the light source device 200 including the circuit device 100. Note that the constituent elements that have been described with reference to FIG. 9 are given the same reference signs, and the description of the constituent elements will be appropriately omitted.

In FIG. 11, a P-type transistor 16 is provided as a first switching element. A source of the P-type transistor 16 is connected to the first power supply node NVI to which the input power supply voltage VIN is to be input. Also, in FIG. 11, the circuit device 100 includes a power supply circuit 194. The power supply circuit 194 generates a power supply voltage VHB from the input power supply voltage VIN. The potential of the power supply voltage VHB is a potential that causes the P-type transistor 16 to turn on, and is lower than the potential of the input power supply voltage VIN and higher than the potential of the ground power supply voltage PGND. The high potential-side power supply voltage of the first drive circuit 110 is the input power supply voltage VIN, and the low potential-side power supply voltage thereof is the power supply voltage VHB.

In the configuration shown in FIG. 11, the power supply voltage VHB is supplied to a source of an N-type transistor in the first drive circuit 110, and the ground power supply voltage PGND is supplied to a source of an N-type transistor in the second drive circuit 112. Although the power supply voltage VHB and the ground power supply voltage PGND are different power supply voltages, as a result of isolating N-type transistors by N-type wells, as described with reference to FIG. 5 and the like, the above-described two types of N-type transistors can be provided. Note that when the circuit device 100 is configured as described in FIG. 11, the potential VX in FIGS. 2 and 5 corresponds to the power supply voltage VHB.

6. Electronic Apparatus

Figure 12:
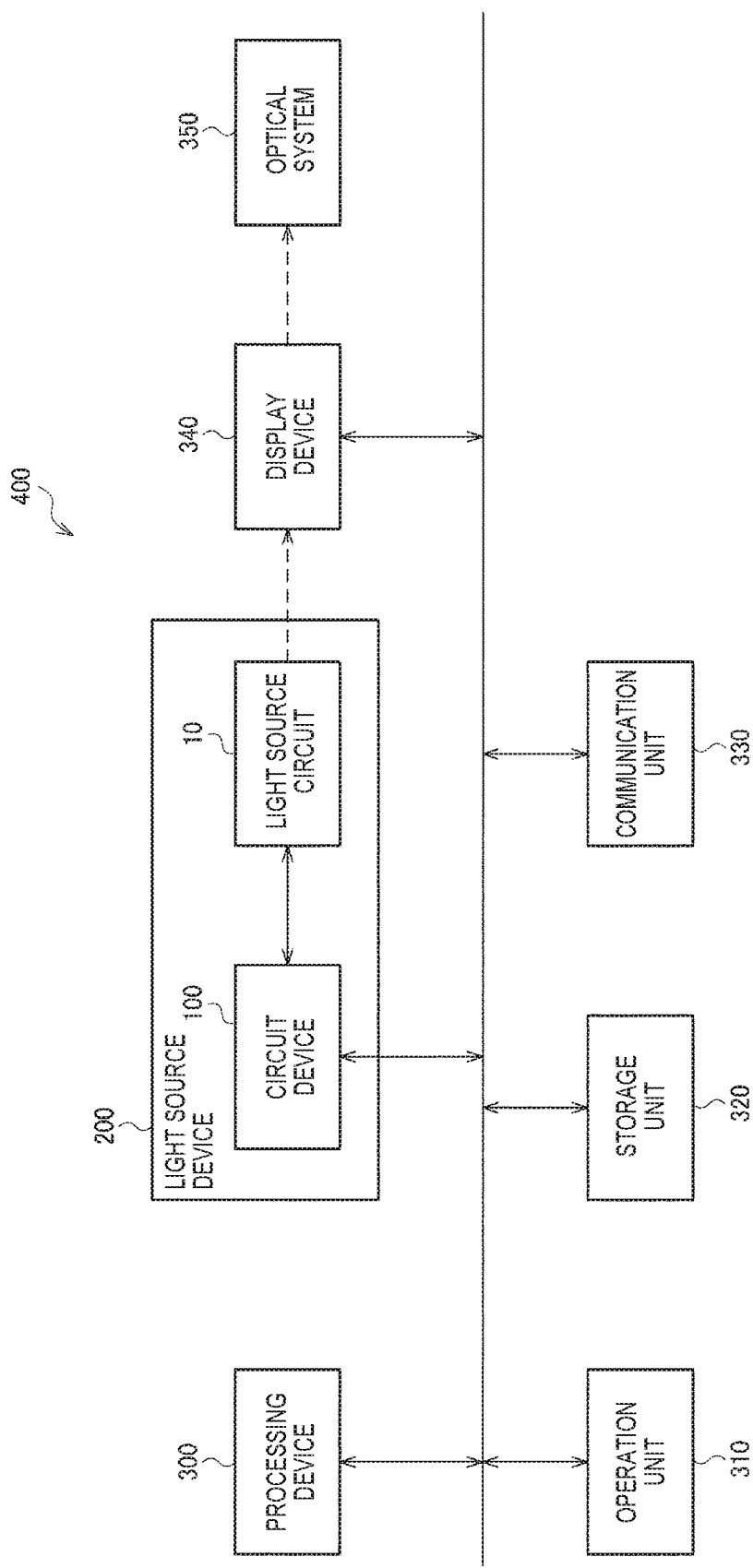
FIG. 12 shows an exemplary configuration of an electronic apparatus.

FIG. 12 shows an exemplary configuration of an electronic apparatus 400 including the light source device 200. A projection type video display device is shown in FIG. 12 as an example of the electronic apparatus 400. The projection type video display device is a device that projects a video on a screen, and is also referred to as a projector. The electronic apparatus 400 includes a light source device 200, a processing device 300, an operation unit 310, a storage unit 320, a communication unit 330, a display device 340, and an optical system 350. The light source device 200 includes the circuit device 100 and the light source circuit 10.

The communication unit 330 communicates with an information processing device such as a PC. The communication unit 330 is one or more of various types of video interfaces conforming to the VGA standard, the DVI standard, the HDMI (registered trade mark) standard. Alternatively, the communication unit 330 may be a communication interface such as the USB standard, or may also be a network interface such as a LAN. The storage unit 320 stores image data input from the communication unit 330. Also, the storage unit 320 may also function as a working memory of the processing device 300. The storage unit 320 is one or more of various storage devices such as a semiconductor memory and a hard disk drive. The operation unit 310 is a user interface for a user to operate the electronic apparatus 400. For example, the operation unit 310 is a button, a touch panel, a pointing device, a character input device, or the like. The processing device 300 is a processor such as a CPU or an MPU. The processing device 300 transmits image data stored in the storage unit 320 to the display device 340. Also, the processing device 300 performs light modulation control by outputting a PWM signal and a light modulation voltage to the circuit device 100. The display device 340 includes a liquid crystal display panel and a display driver that causes the liquid crystal display panel to display an image based on the image data. Light from the light source circuit 10 is incident on the liquid crystal display panel, and the light that has passed through the liquid crystal display panel is projected on the screen by the optical system 350. In FIG. 12, the light path is indicated by dotted-line arrows.

The circuit device of the present embodiment described above includes a first N-type well on a P-type substrate, a first P-type well provided in the first N-type well, a first circuit element provided in the first P-type well, a second N-type well on the P-type substrate, a second P-type well provided in the second N-type well, and a second circuit element provided in the second P-type well. A first ground power supply voltage is supplied to the first P-type well. A power supply voltage different from the first ground power supply voltage is supplied to the second P-type well. The first ground power supply voltage or a first potential that is greater than or equal to the potential of the first ground power supply voltage and less than the potential of a high potential-side power supply voltage is supplied to the first N-type well.

According to the present embodiment, since the first ground power supply voltage or the first potential is supplied to the first N-type well, the potential of the first N-type well 61 can be set to an appropriate potential. That is, because the potential supplied to the first N-type well is lower than the potential of the high potential-side power supply voltage, element breakdown can be suppressed from occurring. Also, a current path from the high potential-side power supply voltage to the first N-type well disappear, and therefore the occurrence of an unexpected leak current flowing from the high potential-side power supply voltage to the first N-type well can be suppressed.

Also, in the present embodiment, a second ground power supply voltage different from the first ground power supply voltage may be supplied to the second P-type well.

According to the present embodiment, the first P-type well is isolated from the P-type substrate by the first N-type well, and the second P-type well is isolated from the P-type substrate by the second N-type well. With such a triple well structure, different ground power supply voltages can be respectively supplied to the first P-type well and the second P-type well. In the present embodiment, the potentials of the N-type wells in such a triple well structure can be set to appropriate potentials.

Also, in the present embodiment, the first circuit element may be an N-type transistor having a source supplied with the first ground power supply voltage.

According to the present embodiment, an N-type transistor having a triple well structure is configured, and the potential of the N-type well of the triple well structure can be appropriately set.

Also, in the present embodiment, an output terminal connected to a drain of the N-type transistor may be included.

A parasitic bipolar transistor is formed in the N-type transistor having a triple well structure. The collector of the parasitic bipolar transistor is the first N-type well, the emitter is the drain of the N-type transistor, and the base is the first P-type well. When a negative potential is applied to the output terminal connected to the drain of the N-type transistor, a leak current flows from the collector to the emitter of the parasitic bipolar transistor. In the present embodiment, since the first ground power supply voltage or the first potential is supplied to the first N-type well, which is a collector, an unexpected leak current will not flow from a node at the high potential-side power supply voltage through the parasitic bipolar transistor.

Also, in the present embodiment, the circuit device may be provided with a third N-type well that is provided in the P-type substrate, and is supplied with a high potential-side power supply voltage, and a third circuit element provided in the third N-type well.

With this, a third circuit element provided in a third N-type well can be provided along with the first circuit element and the second circuit element having the triple well structure.

Also, in the present embodiment, the third circuit element may be a P-type transistor having a source supplied with the high potential-side power supply voltage.

With this, a P-type transistor provided in the third N-type well can be provided along with the first circuit element and the second circuit element having the triple well structure.

Also, in the present embodiment, the circuit device may include a regulator. The regulator may generate the high potential-side power supply voltage based on an input power supply voltage whose potential is higher than the potential of the high potential-side power supply voltage, and supply the generated high potential-side power supply voltage to the source of the P-type transistor.

In the present embodiment, if a leak current flows through a node at the high potential-side power supply voltage, the leak current flows to a node at the input power supply voltage via the regulator. Since the potential of the input power supply voltage is higher than the potential of the high potential-side power supply voltage, the power loss due to the leak current increases, and there is a risk that heat generation or the like may occur due to the power loss. In the present embodiment, as a result of the potential of the first N-type well being set to an appropriate potential, an unexpected leak current will not flow from a node at the high potential-side power supply voltage, and heat generation or the like due to power loss can be suppressed.

Also, in the present embodiment, the first circuit element may be a protection diode. In the protection diode, the first P-type well may be a cathode, and an N-type impurity region provided in the first P-type well may be an anode.

A parasitic bipolar transistor is formed in the protection diode having a triple well structure. The collector of the parasitic bipolar transistor is the first N-type well, the emitter is the N-type impurity region, and the base is the first P-type well. When a negative potential is applied to the output terminal connected to the cathode of the protection diode, a leak current flows from the collector to the emitter of the parasitic bipolar transistor. In the present embodiment, since the first ground power supply voltage or the first potential is supplied to the first N-type well, which is a collector, an unexpected leak current will not flow from a node at the high potential-side power supply voltage through the parasitic bipolar transistor.

Also, in the present embodiment, the first potential may be supplied to the first N-type well from a node, at a power supply voltage, that is not electrically connected to a node at the high potential-side power supply voltage.

As a result of the first potential being supplied from a node, at a power supply voltage, that is not electrically connected to a node at the high potential-side power supply voltage, even if a leak current flows through the first N-type well, an unexpected leak current will not flow from a node at the high potential-side power supply voltage.

Also, in the present embodiment, the circuit device may include a third N-type well provided in the P-type substrate, a P-type transistor provided in the third N-type well, and an output terminal. The high potential-side power supply voltage may be supplied to the third N-type well. The high potential-side power supply voltage may be supplied to a source of the P-type transistor. The first circuit element may be an N-type transistor having a source supplied with the first ground power supply voltage. The drain of the P-type transistor and the drain of the N-type transistor are connected to the output terminal, and the P-type transistor and the N-type transistor may constitute a driver for outputting an output signal to the output terminal.

In the present embodiment, a parasitic bipolar transistor is formed in the N-type transistor of the driver. A collector of the parasitic bipolar transistor is the first N-type well, an emitter is the drain of the N-type transistor, and a base is the first P-type well. In the present embodiment, the first ground power supply voltage or the first potential is supplied to the first N-type well, which is a collector. With this, even if a negative potential is applied to the output terminal connected to a drain of the N-type transistor, an unexpected leak current will not flow from a node at the high potential-side power supply voltage through the parasitic bipolar transistor.

Also, in the present embodiment, the driver may also be a driver for driving a transistor in a light source circuit.

According to the present embodiment, in a driver that drives a transistor in a light source circuit, the potential of an N-type well of an N-type transistor having a triple well structure can be set to an appropriate potential.

Also, the light source device of the present embodiment includes a circuit device described above, and a light source circuit.

Also, an electronic apparatus of the present embodiment includes any of the circuit devices described above.

Note that although an embodiment has been described in detail above, a person skilled in the art will readily appreciate that it is possible to implement numerous variations and modifications that do not depart substantially from the novel aspects and effect of the disclosure. Accordingly, all such variations and modifications are also to be included within the scope of the disclosure. For example, terms that are used within the description or drawings at least once together with broader terms or alternative synonymous terms can be replaced by those other terms at other locations as well within the description or drawings. Also, all combinations of the embodiment and variations are also encompassed in the range of the disclosure. Moreover, the configuration and operation of the circuit device, the light source circuit, the light source device, and the electronic apparatus, and the like are not limited to those described in the present embodiment, and various modifications are possible.

What is claimed is:

1. A circuit device comprising:
   a first N-type well on a P-type substrate;
   a first P-type well that is provided in the first N-type well, wherein a first ground power supply voltage is supplied to the first P-type well;
   a first circuit element provided in the first P-type well;
   a second N-type well on the P-type substrate;
   a second P-type well that is provided in the second N-type well, wherein a power supply voltage different from the first ground power supply voltage is supplied to the second P-type well; and
   a second circuit element provided in the second P-type well,
   wherein the first ground power supply voltage or a first potential that is (i) greater than or equal to the potential of the first ground power supply voltage and (ii) less than the potential of a high potential-side power supply voltage supplied to a node of the circuit device is supplied to the first N-type well from a node that is not electrically connected to the node of the high potential-side power supply voltage,
   a second ground power supply voltage different from the first ground power supply voltage is supplied to the second P-type well; and
   a coupling circuit provided between the first ground power supply voltage and the second ground power supply voltage.

2. The circuit device according to claim 1, wherein the first circuit element is an N-type transistor having a source supplied with the first ground power supply voltage.

3. The circuit device according to claim 2, further comprising an output terminal connected to a drain of the N-type transistor.

4. The circuit device according to claim 1, further comprising:
   a third N-type well that is provided in the P-type substrate, and is supplied with the high potential-side power supply voltage; and
   a third circuit element provided in the third N-type well.

5. The circuit device according to claim 4, wherein the third circuit element is a P-type transistor having a source supplied with the high potential-side power supply voltage.

6. The circuit device according to claim 5, further comprising a regulator that generates the high potential-side power supply voltage based on an input power supply voltage whose potential is higher than the potential of the high potential-side power supply voltage, and supply the generated high potential-side power supply voltage to the source of the P-type transistor.

7. The circuit device according to claim 1, wherein the first circuit element is a protection diode whose cathode is formed from a P-type impurity region provided in the first P-type well and whose anode is formed from an N-type impurity region provided in the first P-type well.

8. The circuit device according to claim 1, wherein the first potential is supplied to the first N-type well from a node, at a power supply voltage, that is not electrically connected to a node at the high potential-side power supply voltage.

9. The circuit device according to claim 1, further comprising:
   a third N-type well that is provided in the P-type substrate, and is supplied with a high potential-side power supply voltage;

a P-type transistor that is provided in the third N-type well, and has a source supplied with the high potential-side power supply voltage; and an output terminal, wherein the first circuit element is an N-type transistor having a source supplied with the first ground power supply voltage, and the drain of the P-type transistor and the drain of the N-type transistor are connected to the output terminal, and the P-type transistor and the N-type transistor constitute a driver for outputting an output signal to the output terminal.

10. The circuit device according to claim 9, wherein the driver is a driver for driving a transistor in a light source circuit.

11. A light source device comprising:

the circuit device according to claim 10; and the light source circuit.

12. An electronic apparatus comprising the circuit device according to claim 1.

13. A circuit device comprising:

a first N-type well on a P-type substrate;

a first P-type well that is provided in the first N-type well, wherein a first ground power supply voltage is supplied to the first P-type well;

a first circuit element provided in the first P-type well;

a second N-type well on the P-type substrate;

a second P-type well that is provided in the second N-type well, wherein a second power supply voltage different from the first ground power supply voltage is supplied to the second P-type well; and a second circuit element provided in the second P-type well, wherein the first ground power supply voltage is supplied to the first N-type well, a second ground power supply voltage different from the first ground power supply voltage is supplied to the second P-type well; and a coupling circuit provided between the first ground power supply voltage and the second ground power supply voltage.

\* \* \* \* \*